(12) United States Patent
Lombardo et al.

(10) Patent No.: US 12,431,314 B2
(45) Date of Patent: Sep. 30, 2025

(54) SAFETY SYSTEMS FOR BATTERY-SUPPLIED FOGGING DEVICE

(71) Applicant: UR FOG S.R.L., Turin (IT)

(72) Inventors: Mauro Lombardo, Turin (IT); Giovanni Balestrini, Turin (IT); Marco Zangirolami, Turin (IT)

(73) Assignee: UR FOG S.R.L., Turin (IT)

( * ) Notice: Subject to any disclaimer, the term of this patent is extended or adjusted under 35 U.S.C. 154(b) by 196 days.

(21) Appl. No.: 18/013,571

(22) PCT Filed: Jun. 17, 2021

(86) PCT No.: PCT/IT2021/050188
§ 371 (c)(1),
(2) Date: Dec. 29, 2022

(87) PCT Pub. No.: WO2022/009240
PCT Pub. Date: Jan. 13, 2022

(65) Prior Publication Data
US 2023/0282435 A1    Sep. 7, 2023

(30) Foreign Application Priority Data

Jul. 6, 2020  (IT) .................. 102020000016300

(51) Int. Cl.
*H01H 85/06*     (2006.01)
*G01J 1/44*      (2006.01)
(Continued)

(52) U.S. Cl.
CPC .............. *H01H 85/06* (2013.01); *G01J 1/44* (2013.01); *G01K 7/22* (2013.01); *H10N 10/17* (2023.02);
(Continued)

(58) Field of Classification Search
CPC . H01H 85/06; H01H 85/36; G01J 1/44; G01J 2001/446; G01J 2001/4473;
(Continued)

(56) References Cited

U.S. PATENT DOCUMENTS 2,785,860 A * 3/1957 Harrison ................... G01J 5/12
374/129
3,896,289 A * 7/1975 Di Renna .............. G05D 23/24
219/501
(Continued)

FOREIGN PATENT DOCUMENTS

GB    2315683 A    2/1998

OTHER PUBLICATIONS

Vermander, Wim; International Search Report and Written Opinion in PCT/IT2021/050188, Sep. 15, 2021, 9 pages.

*Primary Examiner* — Jacob R Crum
(74) *Attorney, Agent, or Firm* — Benjamin D. Rotman; UB Greensfelder LLP

(57) ABSTRACT

A safety system for a battery-powered fog generator is described, designed to operate on a vaporization coil (2) of a fogging fluid; the safety system includes: a fuse wire (1), each placed at one end of the coil (2), suitable for heating both due to a Joule effect and through heat coming from the coil (2) by thermal conduction, the fusible wire (1) being therefore designed to melt when its temperature exceeds a melting threshold value, interrupting the power supply from the battery to the coil (2); a sensor (6) designed to detect the temperature of the coil (2) when current flows in it; and a control unit (7) operatively connected to the sensor (6).

20 Claims, 2 Drawing Sheets

(51) Int. Cl.
*G01K 7/22* (2006.01)
*H10N 10/17* (2023.01)
*A63J 5/02* (2006.01)
*F41H 9/06* (2006.01)

(52) U.S. Cl.
CPC ............... *A63J 5/025* (2013.01); *F41H 9/06* (2013.01); *G01J 2001/446* (2013.01); *G01J 2001/4473* (2013.01)

(58) Field of Classification Search
CPC . G01K 7/22; H10N 10/17; A63J 5/025; F41H 9/06; F41H 9/08
See application file for complete search history.

(56) References Cited

U.S. PATENT DOCUMENTS

| | | | |
|---|---|---|---|
| 4,547,656 A | 10/1985 | Swiatosz et al. | |
| 4,764,660 A | 8/1988 | Swiatosz | |
| 4,771,259 A * | 9/1988 | Gaia | H01H 85/36 337/165 |
| 5,226,411 A * | 7/1993 | Levine | A61M 16/1075 128/203.26 |
| 5,485,137 A * | 1/1996 | Maleus | H01H 69/02 29/874 |
| 5,870,524 A | 2/1999 | Swiatosz | |
| 5,937,141 A | 8/1999 | Swiatosz | |
| 2004/0218333 A1* | 11/2004 | Innes | H02H 9/021 361/118 |
| 2013/0162387 A1* | 6/2013 | Kelley | H01H 37/761 337/142 |
| 2014/0338685 A1* | 11/2014 | Amir | H05B 1/0244 131/329 |
| 2016/0042904 A1* | 2/2016 | Hou | H01H 37/761 337/407 |
| 2017/0196263 A1* | 7/2017 | Sur | H05B 1/0244 |

* cited by examiner

SAFETY SYSTEMS FOR BATTERY-SUPPLIED FOGGING DEVICE

The present invention relates to safety systems for a battery-powered fog generator.

GB-A-2 315 683 discloses a fog generator according to the preamble of Claim 1.

Object of the present invention is providing safety systems for a battery-powered fog generator that maintains thermal stability in a context of rapid energy exchanges, which intervenes by interrupting the flow of current from the battery in the event that a heat over-temperature of the exchanger is detected from the fogging device, to avoid uncontrolled melting.

In fact, the greater the quantity of vaporized fluid in the unit of time, the more unstable the fogging device is: therefore, the need to have functional and efficient safety systems is essential for the realization of high performance fogging devices.

The aforesaid and other objects and advantages of the invention, as will emerge from the following description, are achieved with safety systems for a battery-powered fog generator such as those described in Claim 1. Preferred embodiments and non-trivial variants of the present invention form the subject of the dependent claims.

It is understood that all attached claims form an integral part of the present description.

It will be immediately obvious that innumerable variations and modifications (for example relating to shape, dimensions, arrangements and parts with equivalent functionality) can be made to what is described, without departing from the scope of the invention as appears from the attached claims.

Figure 1:
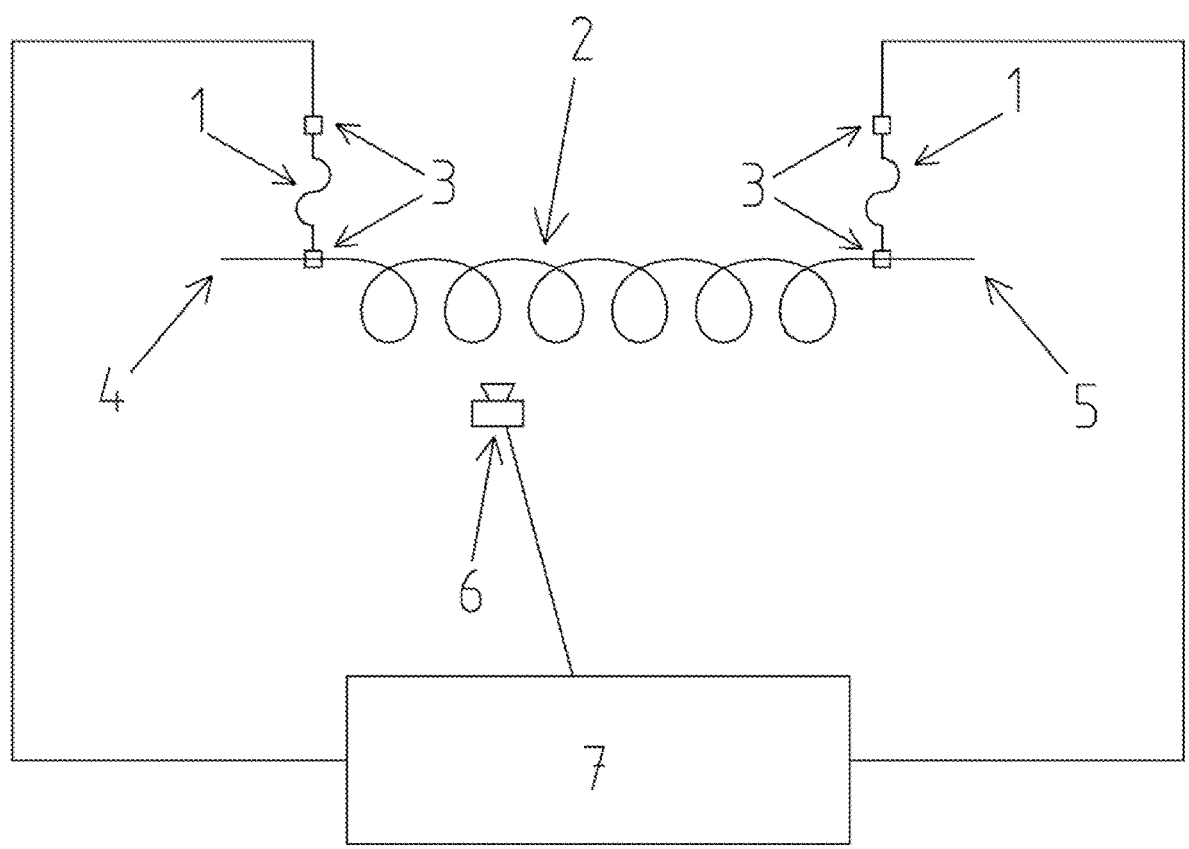
Figure 2:
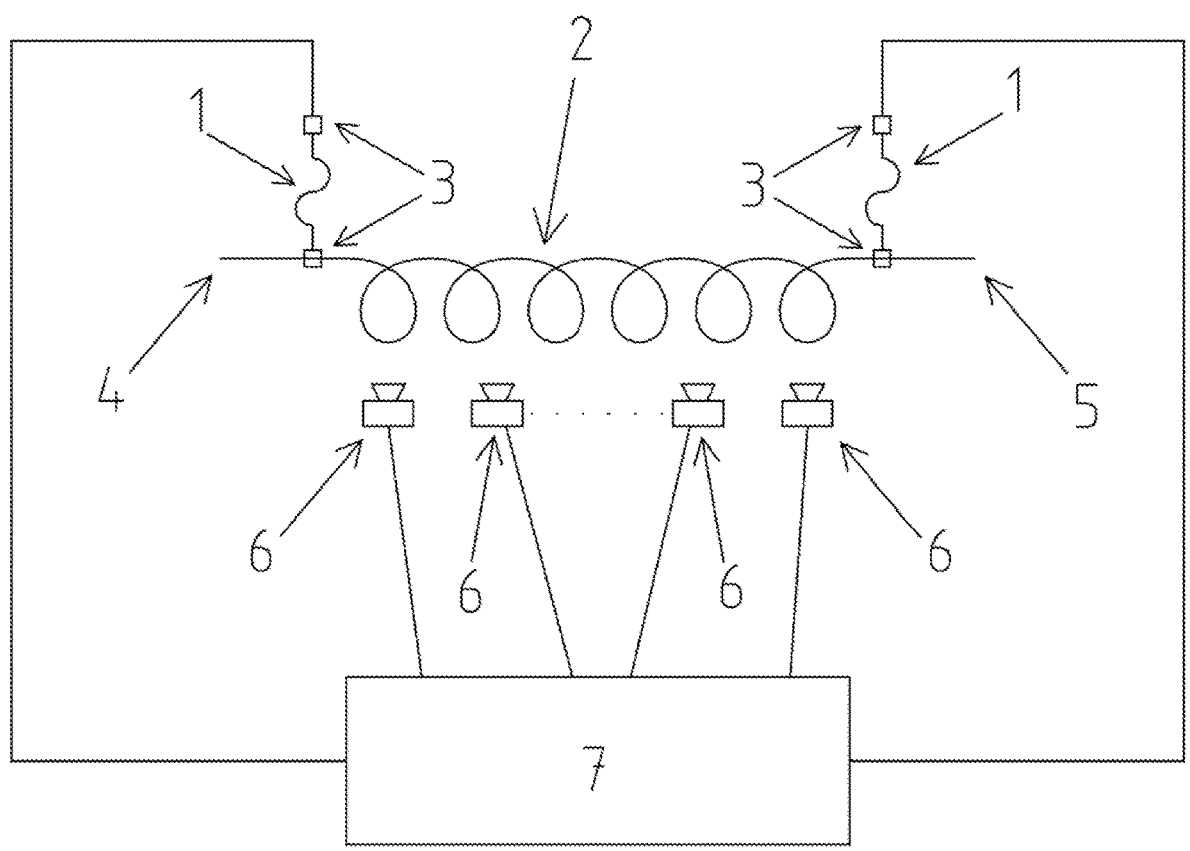

The present invention will be better described by some preferred embodiments thereof, provided by way of non-limiting example, with reference to the attached drawings, in which:

FIG. 1 shows a schematic view of a safety system according to the present invention with the sensors in single configuration; and FIG. 2 shows a schematic view of a safety system according to the present invention with the sensors in multiple configuration.

The present invention relates to safety systems for a battery-powered fog generator.

In the fog generator to which the present invention refers (not illustrated, because it is known), a hollow metal coil 2 is brought to a temperature of several hundred degrees by applying an electric current and thus exploiting the generation of heat by the Joule effect. The rate of change in temperature is very high, exceeding a hundred degrees per second.

When an optimal temperature is reached, the pumping of fog fluid begins at one end 4 of the coil 2. This fluid vaporizes upon contact with the metal walls and is expelled at high pressure at the opposite outlet end 5, where a nozzle is possibly present.

It is clear that the system must reach and maintain a thermal stability in a context of rapid energy exchanges, from the battery (not shown) to the coil 2 and from the latter to the fluid to implement the phase transition: in addition to a control system 7 that keeps the heat exchange temperature constant by adjusting the current to the coil and/or the flow of fog fluid, it is therefore necessary to equip the machine (not shown) with one or more safety mechanisms that intervene by interrupting the flow of current from the coil (s) in the event that an over-temperature of the heat exchanger or coil 2 is detected, to avoid uncontrolled melting.

The safety systems of the present invention are the following:

1) Coil Connection by Fusible Wire

The electrical connection between one or both ends of the coil 2 and the relative power source is carried out by means of a fusible wire 1 of low melting point material. Typical but non-limiting examples are a low-melting silver-brass eutectic alloy or many silver brazing alloys.

During the production of the fog, the fusible wire 1 heats up both by the Joule effect and by the heat that reaches it from the coil 2 by thermal conduction.

Once a certain critical value is exceeded, generally between 400° C. and 600° C. depending on the application, the fuse wire 1 melts, interrupting, in a manner that cannot be reset by the user, the passage of current. The fact that the fog generator remains off for most of the time basically eliminates the problem of separating the components if a metal alloy is used whose constituents have different melting points.

Any loading with springs or similar structures, which apply a mechanical tension to the electrical connection 3, can be used to make the intervention faster and clearer.

2) Low Frequency Pump Motor Driving

The electric control to the pump of the fog generator consists of a square wave with a frequency between 0.5 Hz and 50 Hz and variable duty cycle. The choice of frequency, as well as the variability or otherwise of the same during the shot, is made according to the electrical and physical parameters of the pump/coil/battery assembly: unlike the normal drivers that drive the motor at ultrasonic frequencies or in any case in the range around 15-25 kHz, the low frequency driving allows limiting the onset of instability phenomena during operation, since the alternation of the command on time scales compatible with the thermal transport phenomena favors the homogenization of temperatures along the coil 2.

3) Measurement of the Coil Current

The current measurement can be carried out, as well as with usual methods such as a resistive sense, also with ad-hoc developed systems such as a ferromagnetic core (perhaps obtained from the same frame) possibly coupled with a Hall effect sensor. This increases the reliability of the system, since the adoption of a magnetic flux tube allows the actual sensor to be positioned in a point well protected from the heat generated by the coil 2 itself.

4) Optical Sensing

Upon reaching the temperature of about 700° C., much above the maximum normal operating temperature, the metal coil 2 begins to emit light in the red band. An optical sensor (photodiode, phototransistor, CdS photocell) 6 suitably arranged inside the cabinet of the fog generator and shielded from ambient light, can pick up the red light emitted by the coil 2 and command the interruption of the flow on the basis of this information of current. To improve noise rejection, a red filter can be used in front of the light sensor.

5) Thermal Sensing (Resistive)

One or more thermistors 6, suitably arranged inside the fog device, detect the heat of the coil 2 by irradiation and can control the interruption of the current flow on the basis of this information. The thermistor is a non-linear sensor with very high sensitivity: for this reason it may also be possible to position it behind shielding barriers where a small hole is made to calibrate the amount of radiation that reaches the surface.

A similar argument can be made using a resistance thermometer instead of a thermistor (for example a Pt100 or Pt1000 sensor).

6) Thermal Sensing (Thermopile)

The thermopile is a sensor 6 which, by exploiting the Seebeck effect, generates a potential difference approximately proportional to the thermal gradient between two junctions of different metals. If the cold junction is kept at a reference temperature and the opposite junction is "illuminated" by a thermal radiation that causes it to heat up, the potential difference generated does not depend on the wavelength of the incident radiation. (Technically this result is expressed by saying that the thermopile is a thermal sensor and not a quantum type.) This has the advantage that for the same sensor 6 it is possible to select the frequency response simply by applying in front of it an optical filter suitable for the application in which it is intended to be used.

By placing the reference junction at ambient temperature and pointing the sensor window 6 towards coil 2, it is possible to measure its temperature with sufficient accuracy and then use this data to stop the flow of current when necessary.

All types of sensing proposed (optical, thermal-resistive, thermal-thermopile) can be applied in configuration with a single sensor 6 (FIG. 1) or multiple sensors 6 (FIG. 2) (two or more sensors 6 suitably distributed along the length of the coil 2). In this last case, it is also possible to detect the temperature distribution between the point of the exchanger where the fluid is introduced and the one where the same, now in the vapor phase, pours into the external environment. Any inhomogeneity, although normally present, must never be excessive, since it could lead to a stable condition in which one end of the coil 2 heats up more and more while the opposite end tends to remain cold.

In the case of a single sensor 6, this does not necessarily have to point to the center of the coil 2, but can be positioned in the point deemed most suitable for the purpose.

All the technologies described above can be applied simultaneously in any combination.

The invention claimed is:

1. A safety system for battery-powered fogging device, the safety system being designed to operate on a vaporization coil of a fogging fluid of the fogging device, the safety system comprising:
   at least one fusible wire, each placed at one end of the coil, the fusible wire, during the production of fog by the fogging device, being able to heat up both due to a Joule effect and via heat coming from the coil by thermal conduction, the fusible wire being therefore designed to melt when its temperature exceeds a melting threshold value, interrupting the power supply from the battery to the coil;
   at least one sensor designed to detect the temperature of the coil upon the passage of current in the coil; and
   at least one control unit operatively connected to the at least one sensor,
   wherein the at least one sensor is an optical type sensor, designed to detect, upon reaching a temperature well above the maximum normal operating temperature, light in the red band emitted by the coil, the optical sensor being a photodiode, a phototransistor, or a CdS photocell, and being designed to control, on the basis of the detected light, an interruption of the flow of current, and the control unit being designed to measure the current of the coil, increasing the reliability of the system.

2. The safety system of claim 1, wherein the fusible wire is made with a low-melting silver-brass eutectic alloy or with a silver alloy for brazing.

3. The safety system of claim 1, wherein a red filter is used in front of the light sensor to improve noise rejection.

4. The safety system of claim 1, wherein the at least one sensor is a sensor of the resistive thermal type, composed of one or more thermistors designed to detect the heat of the coil by irradiation and command, on the basis of this information, an interruption of the current flow.

5. The safety system of claim 4, wherein the thermistor is a non-linear sensor with very high sensitivity, designed to be positioned behind shielding barriers in which a small hole is made to calibrate the amount of radiation that reaches its surface.

6. The safety system of claim 1, wherein the at least one sensor is a sensor of the resistive thermal type comprising a thermo-resistance, a Pt100 sensor, or a Pt1000 sensor.

7. The safety system of claim 1, wherein the at least one sensor is a thermopile thermal sensor, designed to generate, by exploiting a Seebeck effect, an approximately proportional potential difference to the thermal gradient between two junctions of different metals, the sensor being designed, after positioning the reference junction at the ambient temperature and pointing a window of the sensor towards the coil, to measure an associated temperature.

8. The safety system of claim 1, wherein the at least one sensor is used in a single configuration.

9. The safety system of claim 1, wherein the at least one sensor is used in multiple configuration, with two or more sensors distributed along the length of the coil, the configuration with multiple sensors allowing to detect also the temperature distribution between the point of the exchanger where fluid is introduced and the one where fluid, now in the vapor phase, is poured into the external environment.

10. The safety system of claim 1, further comprising a control system configured to generate a square wave with a frequency between 0.5 Hz and 50 Hz and a variable duty cycle, making it possible to limit the onset of instability phenomena during the operation of the fogging device.

11. A safety system for battery-powered fogging device, the safety system being designed to operate on a vaporization coil of a fogging fluid of the fogging device, the safety system comprising:
    at least one fusible wire, each placed at one end of the coil, the fusible wire, during the production of fog by the fogging device, being able to heat up both due to a Joule effect and via heat coming from the coil by thermal conduction, the fusible wire being therefore designed to melt when its temperature exceeds a melting threshold value, interrupting the power supply from the battery to the coil;
    at least one sensor designed to detect the temperature of the coil upon the passage of current in the coil;
    at least one control unit operatively connected to the at least one sensor, wherein the control unit is designed to measure the current of the coil, increasing the reliability of the system; and
    a control system configured to generate a square wave with a frequency between 0.5 Hz and 50 Hz and a variable duty cycle, making it possible to limit the onset of instability phenomena during the operation of the fogging device.

12. The safety system of claim 11, wherein the fusible wire is made with a low-melting silver-brass eutectic alloy or with a silver alloy for brazing.

13. The safety system of claim 11, wherein the at least one sensor is an optical type sensor, designed to detect, upon reaching a temperature well above the maximum normal operating temperature, light in the red band emitted by the coil, the optical sensor being a photodiode, a phototransistor, or a CdS photocell, and being designed to control, on the basis of the detected light, an interruption of the flow of current.

14. The safety system of claim 13, wherein a red filter is used in front of the light sensor to improve noise rejection.

15. The safety system of claim 11, wherein the at least one sensor is a sensor of the resistive thermal type, composed of one or more thermistors designed to detect the heat of the coil by irradiation and command, on the basis of this information, an interruption of the current flow.

16. The safety system of claim 15, wherein the thermistor is a non-linear sensor with very high sensitivity, designed to be positioned behind shielding barriers in which a small hole is made to calibrate the amount of radiation that reaches its surface.

17. The safety system of claim 11, wherein the at least one sensor is a sensor of the resistive thermal type comprising a thermo-resistance, a Pt100 sensor, or a Pt1000 sensor.

18. The safety system of claim 11, wherein the at least one sensor is a thermopile thermal sensor, designed to generate, by exploiting a Seebeck effect, an approximately proportional potential difference to the thermal gradient between two junctions of different metals, the sensor being designed, after positioning the reference junction at the ambient temperature and pointing a window of the sensor towards the coil, to measure an associated temperature.

19. The safety system of claim 11, wherein the at least one sensor is used in a single configuration.

20. The safety system of claim 11, wherein the at least one sensor is used in multiple configuration, with two or more sensors distributed along the length of the coil, the configuration with multiple sensors allowing to detect also the temperature distribution between the point of the exchanger where fluid is introduced and the one where fluid, now in the vapor phase, is poured into the external environment.

* * * * *